United States Patent
Bolik et al.

(10) Patent No.: US 9,010,189 B2
(45) Date of Patent: Apr. 21, 2015

(54) DEVICE FOR ACQUIRING AND PROCESSING SENSOR MEASURED VALUES AND FOR CONTROLLING ACTUATORS

(71) Applicant: WABCO GmbH, Hannover (DE)

(72) Inventors: Thomas Bolik, Hannover (DE); Konrad Feyerabend, Hannover (DE); Yves Hansen, Hannover (DE); Joachim Heider, Peine (DE); Joachim Hein, Hannover (DE); Rodmar Ruter, Burgwedel (DE)

(73) Assignee: WABCO GmbH, Hannover (DE)

(*) Notice: Subject to any disclaimer, the term of this patent is extended or adjusted under 35 U.S.C. 154(b) by 149 days.

(21) Appl. No.: 13/941,907

(22) Filed: Jul. 15, 2013

(65) Prior Publication Data

US 2014/0022717 A1   Jan. 23, 2014

(30) Foreign Application Priority Data

Jul. 19, 2012   (DE) .......................... 10 2012 014 407

(51) Int. Cl.
| | |
|---|---|
| G01L 7/00 | (2006.01) |
| H05K 7/14 | (2006.01) |
| G01L 19/00 | (2006.01) |
| G01D 11/24 | (2006.01) |
| G01L 19/14 | (2006.01) |

(52) U.S. Cl.
CPC .............. *H05K 7/14* (2013.01); *G01L 19/0061* (2013.01); *G01D 11/24* (2013.01); *G01L 19/148* (2013.01)

(58) Field of Classification Search
None
See application file for complete search history.

(56) References Cited

U.S. PATENT DOCUMENTS

| | | | |
|---|---|---|---|
| 5,880,372 | A | 3/1999 | Nasiri |
| 6,789,415 | B1 | 9/2004 | Kaiser et al. |
| 2005/0026488 | A1* | 2/2005 | Janssen .......................... 439/275 |
| 2009/0120151 | A1* | 5/2009 | Kuwayama et al. .............. 72/57 |
| 2010/0258099 | A1 | 10/2010 | Andersson et al. |
| 2012/0103089 | A1 | 5/2012 | Cantolino et al. |
| 2013/0109252 | A1* | 5/2013 | Fehling et al. ................ 439/862 |

FOREIGN PATENT DOCUMENTS

| | | |
|---|---|---|
| DE | 197 51 096 A1 | 5/1998 |
| DE | 199 17 941 A1 | 10/2000 |
| DE | 698 27 750 T2 | 11/2005 |
| DE | 60 2005 000 329 T2 | 5/2007 |
| DE | 10 2007 001 995 A1 | 7/2007 |
| DE | 10 2006 019 895 A1 | 11/2007 |
| DE | 10 2006 027 748 A1 | 12/2007 |
| DE | 10 2006 027 750 A1 | 12/2007 |

(Continued)

*Primary Examiner* — Andre Allen
(74) *Attorney, Agent, or Firm* — Kramer Levin Naftalis & Frankel LLP

(57) ABSTRACT

A device for acquiring and processing sensor measured values and/or for controlling actuators has a base housing, sensors and/or actuators attached to the base housing, a cover that can be connected to the base housing to cover the sensors and/or actuators, and a circuit board with control electronics. To mount the circuit board easily and effect secure contact of the sensors therewith, the circuit board is securely connected to the inner side of the cover using press-fit connectors, the circuit board has electrically active first contact faces on its side remote from the cover, the sensors and/or actuators have electrically active second contact faces on their sides facing the cover, and the second contact faces of the sensors and/or actuators are connected to the first contact faces via electrically conductive contact springs.

11 Claims, 1 Drawing Sheet

(56) References Cited

FOREIGN PATENT DOCUMENTS

| DE | 10 2007 044 346 A1 | 4/2008 |
| DE | 10 2007 031 246 A1 | 7/2008 |
| DE | 10 2008 023 457 A1 | 5/2009 |
| DE | 10 2008 042 099 A1 | 3/2010 |
| DE | 10 2008 049 193 A1 | 1/2011 |
| DE | 10 2010 063 709 A1 | 6/2012 |
| DE | 10 2011 075 901 A1 | 11/2012 |

* cited by examiner

DEVICE FOR ACQUIRING AND PROCESSING SENSOR MEASURED VALUES AND FOR CONTROLLING ACTUATORS

CROSS-REFERENCE TO RELATED APPLICATION

This application claims the benefit of DE 10 2012 014 407.5 filed on Jul. 19, 2012, the disclosure of which is hereby incorporated herein by reference in its entirety.

FIELD OF THE INVENTION

The present invention generally relates to an improved device for acquiring and processing sensor measured values and/or for controlling actuators, having a base housing, sensors and/or actuators attached to the base housing, a cover that can be connected to the base housing to cover the sensors and/or actuators, and a circuit board that has control electronics.

BACKGROUND OF THE INVENTION

A field of application for a device of the general type under consideration may be a vehicle brake system in which there is no mechanical coupling between the brake activation pedal and the main brake cylinder of the brake unit. The main characteristic variables for performing closed-loop control of such brake systems form the operating pressures that occur in the hydraulic system, that is, the brake circuits, and that are acquired by pressure sensors and converted into electrical measured values. Control electronics evaluate these measured values together with other sensor signals and generate corresponding actuation signals for an actuator of the brake unit.

In conventional pressure measuring systems, the sensors form part of the respective control electronics and are mechanically and electrically connected to the circuit board thereof. A substantial disadvantage of such devices is that even if only the electronics or only the sensors fail, the electronics and sensors must be jointly replaced in each case, which gives rise to correspondingly high costs.

DE 199 17 941 A1 describes a brake device for a vehicle brake system having a pressure measuring system in which one or more pressure sensors are respectively securely connected to a base housing or hydraulic block that conducts the hydraulic fluid, while the control electronics for evaluating the measured values and generating control signals are divided in each case among the individual pressure sensors in dome-like housings fitted over the pressure sensors. The part of the control electronics that is respectively assigned to a pressure sensor is accommodated in correspondingly configured receptacles of the housings and connected to separate contact faces that are placed in contact with the control electronics, arranged in a punched grill carrier and on which contact springs come to bear when the housings are placed in position.

Although this known arrangement permits the pressure sensor and control electronics to be exchanged separately, it is complicated and expensive in terms of manufacturing and mounting technology, in particular if a multiplicity of pressure sensors are provided, since the parts of the control electronics that are assigned to the pressure sensors are mounted individually in the housings assigned thereto and, in any case, have to be subsequently connected to one another to form an overall control electronics system. In order to avoid loading the control electronics with the pressure forces of the contact springs, the separate contact faces arranged in a punched grill and configured mechanically to absorb the pressure forces are additionally provided, further complicating this arrangement.

SUMMARY OF THE INVENTION

Generally speaking, against this background, it is an object of the present invention to provide a device for acquiring and processing sensor measured values and/or for controlling actuators that is of simpler construction than conventional devices and therefore more cost-effective in terms of manufacturing and mounting technology. The present invention is based on the realization that manufacture and mounting can be simplified considerably if the control electronics and the cover of the device are combined to form one component, that is, in the sense of a pre-mounted component, independently of the number of pressure sensors or else actuators used, that is, in particular, in the case of a device with a plurality of pressure sensors and actuators.

According to an embodiment of the present invention, the circuit board is securely connected to the inner side of the cover using press-fit connectors. The circuit board has electrically active first contact faces on its side remote from the cover. The sensors and/or actuators have electrically active second contact faces on their sides facing the cover, and the second contact faces of the sensors and/or actuators are connected to the first contact faces on the circuit board via electrically conductive contact springs.

A substantial advantage of this arrangement emerges from the embodiment of the printed circuit board with its contact faces with which contact can be made directly, and from the mounting of the circuit board on the cover by means of the press-fit connectors. These press-fit connectors permit simple connection of the circuit board to the cover. Since the circuit board is designed such that contact can be made with it directly, the need for separate lines, which have to be connected electrically to the circuit board by solder points, to the sensors and/or actuators is avoided.

Preferably, at least some of the press-fit connectors are arranged on the circuit board precisely with respect to the first contact faces of the circuit board or in the vicinity of these first contact faces of the circuit board. As a result, the pressure forces applied to the circuit board by the contact springs are directed through the circuit board into the press-fit connectors and from there into the cover, with the result that the circuit board does not experience any sagging as a result of the pressure forces of the contact springs.

In addition, the cover can have, on its inner side, i.e., in the direction of the sensors and/or actuators, inwardly protruding supporting projections on which the circuit board is additionally supported in the mounted state. Thus, the circuit board is supported on both sides at a plurality of locations using the press-fit connectors, the supporting projections and the contact springs, with the salutary result that the circuit board experiences virtually no excitation and disadvantageous oscillations.

The sensors may be embodied, for example, as pressure sensors, temperature sensors, acceleration sensors or moisture sensors, and the actuators are preferably embodied such that they can perform open-loop and closed-loop control on fluid flows.

Further advantages arise, in particular, for an arrangement in which the device has a plurality of sensors and/or actuators. In such case, the control electronics for all the sensors and/or actuators are arranged in a single circuit board, which is attached, as described, to the inner side of the cover. In this way, the formation of contact with all the sensors and/or actuators can be carried out simultaneously by fitting the cover onto the base housing. Accordingly, it is possible to exchange individual sensors and/or actuators as necessary after the cover has been removed.

According to a further embodiment, the respective sensors have a sensor measuring cell and electronics assigned thereto, wherein the sensor measuring cells of the respective sensor are arranged in a common sensor housing. The sensor-side cylindrical end of the contact springs is preferably accommodated here in an assigned cylindrical continuous bore, wherein the respective continuous bore is assigned to an electrical contact face of the sensor measuring cell.

In order to secure the respective contact spring in the continuous bore, and, as a result, protect against dropping out, the external diameter of the cylindrical sensor-side end of the contact springs is preferably adapted to the diameter of the cylindrical continuous bores such that contact springs are secured in the assigned continuous bores. For this purpose, the contact springs have, at their sensor-side end a diameter excess portion compared to the diameter of the continuous bores, which excess portion is sufficiently dimensioned for this purpose but still permits the contact springs to be inserted comparatively easily into the assigned continuous bore.

According to another embodiment of the present invention, the sensors and/or actuators are mechanically attached to the base housing by clamps. If the respective sensor is embodied as a pressure sensor, or the actuator is embodied as an actuator that performs open-loop or closed-loop control on a fluid flow, the pressure sensor or actuator is fluidly connected by a pressure hose or by a metallic pressure line to a space of the base housing that conducts hydraulic fluid. This measure permits individual pressure sensors and/or actuators to be exchanged easily.

It is also possible to provide a pressure measuring cell of a pressure sensor embodied as a ceramic body with strain gauge strips arranged thereon, and to arrange the contact face of the pressure sensor for the contact spring directly on the pressure measuring cell.

According to another embodiment, the pressure sensors can also each be embodied as a pressure cell whose change in shape in the event of a change in pressure is transmitted suitably to the assigned electronics.

Still other objects and advantages of the present invention will in part be obvious and will in part be apparent from the specification.

The present invention accordingly embodies features of construction, combinations of elements, and arrangement of parts, all as exemplified in the following detailed disclosure, and the scope of the invention will be indicated in the claims.

BRIEF DESCRIPTION OF THE DRAWINGS

For a fuller understanding of the inventive embodiments, reference is had to the following description taken in connection with the accompanying drawings in which.

DETAILED DESCRIPTION OF THE PREFERRED EMBODIMENTS

Figure 1:
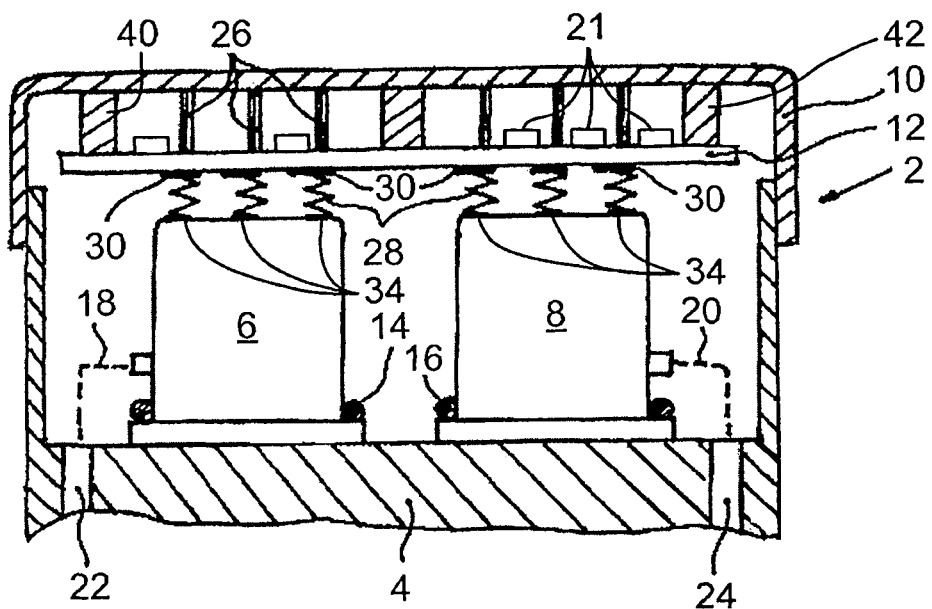
FIG. 1 is a partially sectional side view of a device for acquiring and processing measured values of a pressure sensor and/or for controlling an actuator in accordance with an exemplary embodiment of the present invention.

The device 2 depicted in FIG. 1 has a base housing 4 that conducts a hydraulic pressure and that can also be referred to as a hydraulic block or pneumatic block. A pressure sensor 6 is securely connected to the base housing 4 and picks up a hydraulic pressure. Device 2 further includes an actuator 8 that performs open-loop or closed-loop control on a fluid flow. A cover 10 is fitted onto the base housing 4 in which a printed circuit board 12 is arranged. Printed circuit board 12 is fitted with control electronics 21 including electronic components.

The pressure sensor 6 and the actuator 8 are attached to the base housing 4 by securing clamps 14 and 16, respectively. In fluidic terms, the pressure sensor 6 is connected by means of a pressure hose 18 to a first duct 22, conducting a hydraulic fluid, of the base housing 4. The actuator 8 is connected via a line 20 to an assigned second duct 24 in the base housing 4.

The printed circuit board 12 is arranged on the cover 10 and is mechanically secured to the inner side thereof by means of press-fit connectors 26. Furthermore, the cover 10 has, on its inner side, a plurality of supporting projections 40, 42 on which the circuit board 12 rests.

The electrical contact between the pressure sensor 6 or the actuator 8, on the one hand, and the circuit board 12 fitted with the control electronics 21, on the other hand, is carried out by means of respectively assigned contact springs 28, which are arranged between the circuit board 12 and the pressure sensor 6 or the actuator 8. In this context, the contact springs 28 are supported directly on the circuit board side on first electrical contact faces 30, which are formed remotely from the cover on the circuit board 12. As shown in FIG. 1, the press-fit connectors 26 are arranged on the side of the circuit board 12 near the cover, precisely opposite the first electrical contact faces 30 or precisely opposite the contact springs 28, with the result that the latter can take up the force applied to the circuit board 12 by the contact springs 28 and can pass on the force to the cover 10. The same effect is also achieved when the press-fit connectors 26 are not arranged precisely opposite the contact springs 28 but instead merely in the direct vicinity thereof. The contact springs 26 also rest on assigned, second electrical contact faces 34 on the sensors 6 or actuators 8, as is explained in more detail below.

The pressure sensor 6 and the actuator 8 have, in part, a conventional design. Accordingly, the pressure sensor 6 has a pressure measuring cell 32 and electronics 33, which are assigned to the pressure measuring cell 32 and have the purpose of converting the fluid pressures taken up into electrical measuring signals. The pressure measuring cell 32 is, for example, a ceramic body on which strain gauge strips are arranged, the different strain values of which at different pressures form a measure of the hydraulic pressure. According to another embodiment, the pressure sensor can be embodied as a pressure cell, the change in shape of which in the event of a change in pressure also constitutes a measure of the measured pressure.

Figure 2:
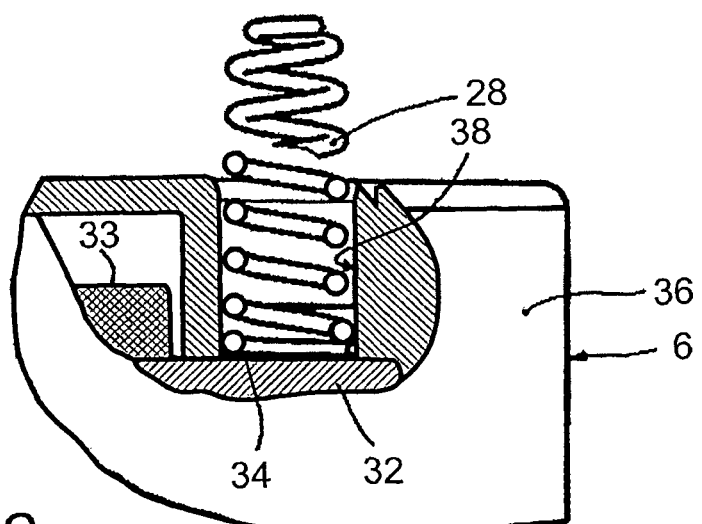
FIG. 2 is a partially sectional side view of the pressure sensor depicted in FIG. 1.

FIG. 2 shows the pressure sensor 6 in greater detail. A pressure measuring cell 32 is arranged therein and composed of a ceramic material. Sensor-side electronics 33 are assigned thereto and have the purpose of converting the hydraulic pressure that is taken up into an electrical measuring signal. A second electrical contact face 34 is arranged directly on the pressure measuring cell 32. In the region of the second electrical contact face 34, a cylindrical continuous bore 38 is formed in the cover wall of the sensor housing 36 and accommodates a contact spring 28, which is largely cylindrical in the accommodating region. The width of the turns of the sensor-side end of the contact spring 28 is adapted to the geometry and the dimensions of the continuous bore 38 such that the contact spring 28 is firmly secured in the continuous bore 38. For this purpose, the sensor-side end of the contact spring 28 has, for example, a very small excess portion compared to the diameter of the continuous bore 38. Securing the sensor-side end of the contact spring 28 merely serves as protection against loss during an assembly process of the device 2 as a whole.

As is apparent from the above, the formation of electrical contacts between the circuit board 12 and all the sensors 6 and actuators 8 takes place automatically when the cover 10 is fitted onto the base housing 4. It is possible to exchange a defective sensor 6 or actuator 8 readily and at low cost after the cover 10 has been removed from the base housing 4.

It will thus be seen that the objects set forth above, among those made apparent from the preceding description, are efficiently attained, and since certain changes may be made in the above constructions without departing from the spirit and scope of the invention, it is intended that all matter contained in the above description or shown in the accompanying drawings shall be interpreted as illustrative and not in a limiting sense.

It is also to be understood that the following claims are intended to cover all of the generic and specific features of the invention herein described and all statements of the scope of the invention that, as a matter of language, might be said to fall therebetween.

What is claimed is:

1. A device for acquiring and processing sensor measured values and/or for controlling actuators, the device comprising a base housing, at least one of sensors and actuators attached to the base housing, a cover connectable to the base housing to cover the at least one of sensors and actuators, and a circuit board including control electronics, the circuit board being securely connected to an inner side of the cover via press-fit connectors, the circuit board having electrically active first contact faces on a side remote from the cover, the at least one of sensors and actuators having electrically active second contact faces on sides facing the cover, the second contact faces of the at least one of sensors and actuators being connected to the first contact faces via electrically conductive contact springs.

2. The device as claimed in claim 1, wherein at least some of the press-fit connectors are arranged on the circuit board one of (i) precisely with respect to the first contact faces and (ii) proximate the first contact faces.

3. The device as claimed in claim 1, wherein the inner side of the cover includes protrusions configured to support the circuit board.

4. The device as claimed in claim 1, wherein the device includes the sensors, the sensors including at least one of pressure sensors, temperature sensors, acceleration sensors and moisture sensors.

5. The device as claimed in claim 4, further comprising a sensor measuring cell and electronics assigned to the sensor measuring cell arranged in a common sensor housing, and wherein a cylindrical sensor-side end of a contact spring is accommodated in a cylindrical continuous bore assigned to a contact face of the sensor measuring cell.

6. The device as claimed in claim 5, wherein an external diameter of the cylindrical sensor-side end of the contact spring is adapted to a diameter of the assigned cylindrical continuous bore such that the contact spring is captively securable in the assigned cylindrical continuous bore.

7. The device as claimed in claim 5, wherein the sensor measuring cell includes a ceramic body having strain gauge strips arranged thereon.

8. The device as claimed in claim 5, wherein the contact face is arranged directly on the sensor measuring cell.

9. The device as claimed in claim 4, wherein the sensors include at least one pressure sensor fluidly connected by at least one of a pressure hose and a metallic pressure line to a duct of the base housing that conducts hydraulic fluid.

10. The device as claimed in claim 1, wherein the device includes the actuators, the actuators being configured to perform open-loop and closed-loop fluid flow control.

11. The device as claimed in claim 1, wherein the at least one of sensors and actuators are attached to the base housing by clamps.

* * * * *